United States Patent [19]

Iwaoka et al.

[11] Patent Number: 4,536,712
[45] Date of Patent: Aug. 20, 1985

[54] METHOD AND APPARATUS FOR EXAMINATION BY NUCLEAR MAGNETIC RESONANCE

[75] Inventors: Hideto Iwaoka; Kenji Fujino; Tadashi Sugiyama; Hiroyuki Matsuura, all of Musashino, Japan

[73] Assignee: Yokogawa Hokushin Electric Corporation, Tokyo, Japan

[21] Appl. No.: 528,599

[22] Filed: Sep. 1, 1983

[30] Foreign Application Priority Data

Sep. 9, 1982 [JP] Japan .................. 57-157274

[51] Int. Cl.³ .......................................... G01R 33/08
[52] U.S. Cl. .................................... 324/309; 324/307
[58] Field of Search .............. 324/300, 307, 309, 312, 324/314, 315

[56] References Cited
U.S. PATENT DOCUMENTS

| | | | |
|---|---|---|---|
| 4,115,730 | 9/1978 | Mansfield | 324/309 |
| 4,297,637 | 10/1981 | Crooks | 324/309 |
| 4,300,096 | 11/1981 | Harrison | 324/309 |
| 4,315,216 | 2/1982 | Clow | 324/309 |
| 4,318,043 | 3/1982 | Crooks | 324/309 |
| 4,431,968 | 2/1984 | Edelstein | 324/309 |

Primary Examiner—Michael J. Tokar
Attorney, Agent, or Firm—Moonray Kojima

[57] ABSTRACT

An examination method and apparatus utilizes a nuclear magnetic resonance technique in which the body of a subject to be examined is placed in a uniform static magnetic field and subjected to an electromagnetic wave having a frequency which induces nuclear magnetic resonance, a magnetic field is also applied to the subject body to specify an area of the body from which nuclear magnetic resonance (NMR) signals are radiated, and such nuclear magnetic resonance signals from the specified body area are received. A first 90° pulse as the electromagnetic wave is applied to the body to excite the same, and then a 180° pulse is applied to the body to produce an echo signal. A second 90° pulse is to the body when the echo signal is maximum to thereby allow a magnetization to return to a state of thermal equilibrium. The foregoing sequence of the steps is repeated at prescribed intervals.

7 Claims, 33 Drawing Figures

METHOD AND APPARATUS FOR EXAMINATION BY NUCLEAR MAGNETIC RESONANCE

BACKGROUND OF THE INVENTION

1. Field of the Invention

The present invention relates to a method and an apparatus for examination utilizing a nuclear magnetic resonance (hereinafter referred to as an "NMR") phenomenon to determine a particular atomic nucleus distribution within the body of a subject being examined from the outside of the body, and more particularly to an NMR examination method and apparatus suitable for use in medical diagnostic systems.

The principles of an NMR technique will first be described prior to the description of the prior art and the present invention.

An atomic nucleus is composed of protons and neutrons which rotate as a whole with a nuclear spin angular momentum I. FIGS. 1A and 1B of the accompanying drawings show an atomic nucleus of hydrogen ($^1H$). As shown in FIG. 1A, the hydrogen atomic nucleus has a single proton P making rotation expressed by a spin quantum number $\frac{1}{2}$. Since the proton P has a positive electric charge e+ as illustrated in FIG. 1B, a magnetic moment $\mu$ is produced as the atomic nucleus rotates. Thus, each hydrogen atomic nucleus can be regarded as one small magnet.

FIGS. 2A and 2B schematically illustrate how atomic nuclei as small magnets are oriented. For a ferromagnetic material such as iron, atomic nuclei as small magnets are directed in alignment as shown in FIG. 2A, and the material as a whole exhibits a magnetization. For elements such as hydrogen, however, atomic nuclei as small magnets are oriented randomly in various directions, that is, they have their magnetic moments directed in various directions, as illustrated in FIG. 2B, and the material has no magnetization as a whole.

When such a material is placed in a static magnetic field $H_0$ in the direction of Z, each atomic nucleus is aligned in the direction of the magnetic field $H_0$, that is, the nuclear energy level is quantized in the direction of Z.

FIG. 3A shows the manner in which hydrogen atomic nuclei are oriented in a static magnetic field. Since the spin quantum number of a hydron atomic nucleus is $\frac{1}{2}$, it has two energy levels of $-\frac{1}{2}$ and $+\frac{1}{2}$ as shown in FIG. 3B. The energy gap $\Delta E$ between the two energy levels can be expressed by the following equation (1):

$$\Delta E = \delta h H_0 \tag{1}$$

where $\delta$: Gyromagnetic ratio,
$h = h/2\pi$
h: Planck's constant.

Because each atomic nucleus undergoes the force expressed by $$\mu \times H_0$$

due to the static magnetic field $H_0$, the atomic nucleus precesses about the Z-axis at an angular velocity given by the equation (2)

$$\omega = \gamma H_0 \text{ (Larmor angular velocity)} \tag{2}$$

When this system is subjected to an electromagnetic wave (normally known as a radio wave) having a frequency corresponding to the angular velocity $\omega$, there occurs a resonance and the atomic nucleus absorbs an energy equivalent to the energy gap $\Delta E$ expressed by the equation (1) and is shifted to a higher energy level. Even where several kinds of atomic nuclei having nuclear spin angular momentums are present in a mixed state, the different atomic nuclei have their respective Gyromagnetic ratios and the frequencies at which they resonate are varied, so that the resonance of a particular kind of atomic nuclei can be picked up. By measuring the intensity of the picked-up resonance, the amount of atomic nuclei present can be determined. The atomic nuclei which have shifted to the higher energy level will return to the lower energy level upon elapse of an interval of time determined by a time constant known as a relaxation time after the resonance.

There are two types of relaxation times; a spin-lattice relaxation time (longitudinal relaxation time) $T_1$ and a spin-spin relaxation time (transverse relaxation time) $T_2$. Data on a material distribution can be obtained by observing these relaxation times. Since spins generally are substantially fixed in a position on a crystal lattice for solid materials, it is relatively easy for the spins to interact with each other. Therefore, solid materials have a short relaxation time $T_2$, and the energy created by nuclear magnetic resonance is first spread into the spin system and then into the lattice system. Accordingly, the relaxation time $T_1$ is much longer than the relaxation time $T_2$. In liquids, however, molecules freely move and thus the ease with which energy exchange is liable to occur remains substantially the same for a spin-spin system and for a spin-molecule (lattice) system. Consequently, the relaxation times $T_1$, $T_2$ are substantially equal to each other. The relaxation time $T_1$ is a time constant dependent on how compound molecules are bonded, and it has been known that normal tissues and malignant tumors have widely different relaxation times $T_1$.

It is possible to effect the same measurements with other atomic nuclei having nuclear spin angular momentums than hydrogen atomic nuclei ($^1H$). Examples of such other atomic nuclei include phosphorus atomic nuclei ($^{31}P$), carbon atomic nuclei ($^{13}C$), sodium atomic nuclei ($^{23}Na$), fluorine atomic nuclei ($^{19}F$), and oxygen atomic nuclei ($^{17}O$).

Accordingly, the amount of a certain kind of atomic nuclei and their relaxation times can be measured by NMR. The body of a subject can be examined in various ways by obtaining various items of chemical information on particular atomic nuclei in materials in the body.

2. Description of the Prior Art

Known examination apparatus utilizing an NMR phenomenon operate on the same principles as an X-ray CT by exciting protons in an imaginary section of the body of a subject being examined, finding NMR signals for respective projections in many direction in the body of the subject, and determining the intensity of the NMR signal in each position of the subject body through a reconstruction process.

FIG. 4 of the accompanying drawings shows the waveforms of signals illustrative of an examination process in the prior NMR examination apparatus.

The body of a subject is first placed in a Z-gradient magnetic field $G_z+$ as shown at (B) in FIG. 4, and subjected to RF pulses (90° pulses) each having a narrow frequency spectrum as shown at (A) in FIG. 4. At this time, protons are excited only in a plane characterized by a Larmor angular velocity $\omega = \gamma(H_0 + \Delta Gz)$. If a magnetization M is shown on a revolving coordinate system as shown in FIG. 5A which revolves at an angular velocity $\omega$, the magnetization M is oriented in the direction of y'-axis which is 90° angularly spaced from the direction of z'-axis. Then, x-gradient magnetic field Gx and y-gradient magnetic field Gy are applied to the subject body to generate a two-dimensional magnetic field, thereby detecting an NMR signal as shown at (E) in FIG. 4. Since the magnetization M is progressively dispersed in the directions of the arrows in the planes x', y' as shown in FIG. 5B due to irregularities of the magnetic field, the NMR signal is gradually reduced in intensity until it finally is eliminated upon elapse of the time $\tau$ as illustrated at (E) in FIG. 4. The NMR signal thus obtained is subjected to a Fourier transform, thus providing a projection perpendicular to the gradient magnetic field which is a combination of the x-gradient magnetic field Gx and the y-gradient magnetic field Gy.

The next sequence of operation is repeated in the same manner upon elapse of a predetermined time $\tau'$. The gradient magnetic fields Gx, Gy are slightly changed in each sequence. Thus, the NMR signal corresponding to each projection can be found in many directions in the body of the subject being examined.

With the conventional apparatus, the time period $\tau$ in FIG. 4 required for the NMR signal to disappear ranges from 10 to 20 mS. The prescribed time $\tau'$ required until the next sequence is started is about 1 sec. due to the relaxation time $T_1$. Therefore, assuming that one section of the subject body is to be reconstructed with 128 projections, it will take at least 2 minutes for the particular body section to be thoroughly measured.

SUMMARY OF THE INVENTION

It is an object of the present invention to provide an examination method and apparatus capable of obtaining images of body sections related to particular atomic nucleus distributions in a subject within a short period of time.

Another object of the present invention is to provide an examination method and apparatus capable of finding relaxation times $T_1$, $T_2$ through simple arithmetic operations on the intensities of NMR signals without having to effect complicated measurements.

According to the present invention, the body of a subject to be examined is placed in an uniform static magnetic field and subjected to an electromagnetic wave having a frequency which induces nuclear magnetic resonance. A magnetic field is also applied to the subject body to specify an area of the body from which nuclear magnetic resonance signals are radiated, and such nuclear magnetic resonance signals from the specified body area are received. As the electromagnetic wave imposed on the subject body, a first 90° pulse is applied to the body to excite the body, and then a 180° pulse is applied to the body to produce an echo signal. At the time the echo signal is maximum, a second 90° is applied to the body to allow a magnetization to return to a state of thermal equilibrium. The above sequence of operation is repeated at prescribed intervals.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

Figure 1A:
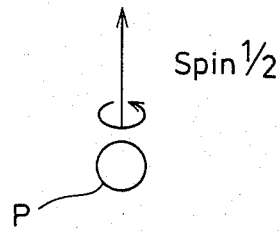
FIGS. 1A and 1B are diagrams showing the manner in which a hydrogen atom spins.
Figure 1B:
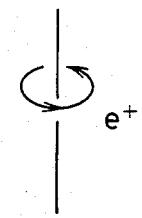
Figure 2A:
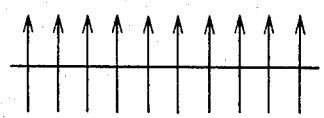
FIGS. 2A and 2B are diagrams showing magnetic moments of atoms of a ferromagnetic material and hydrogen atoms, respectively.
Figure 2B:
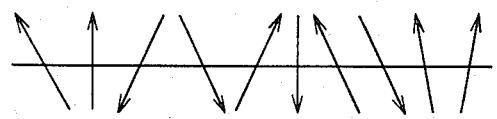
Figure 3A:
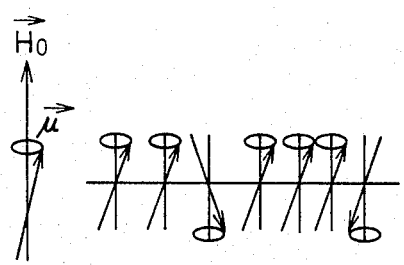
FIGS. 3A and 3B are diagrams illustrative of the way in which hydrogen atomic nuclei are aligned with the direction of a magnetic field applied.
Figure 3B:
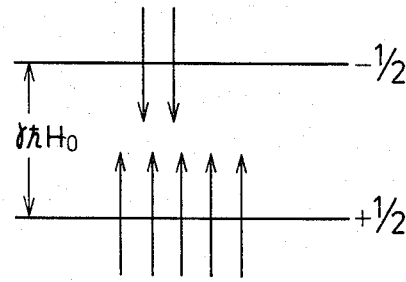
Figure 4:
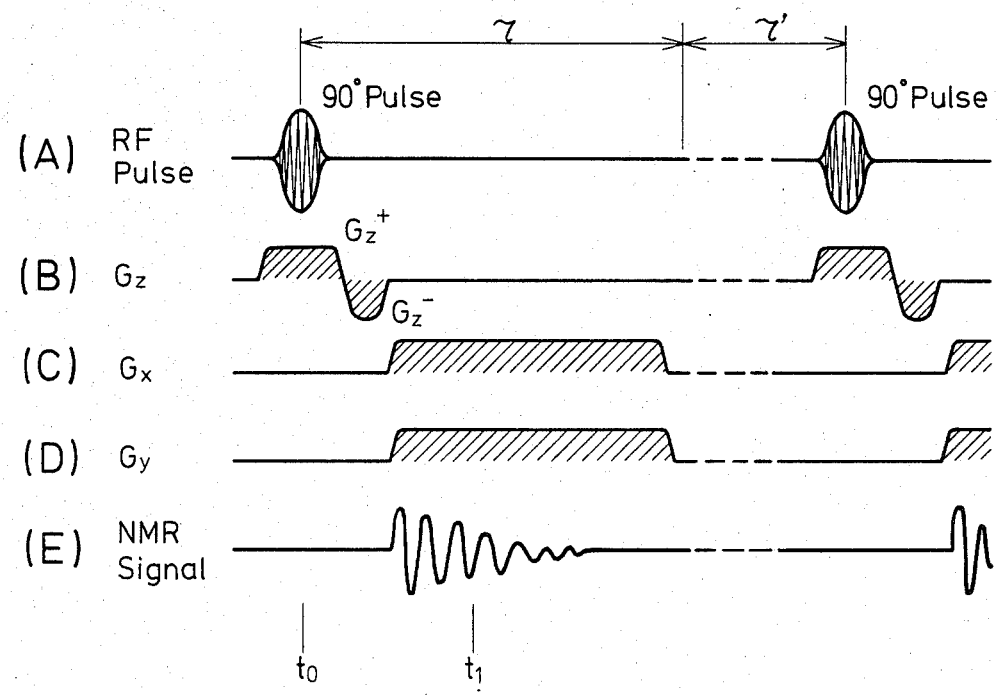
FIG. 4 a diagram of examination pulse waveforms employed in an NMR technique.
Figure 5A:
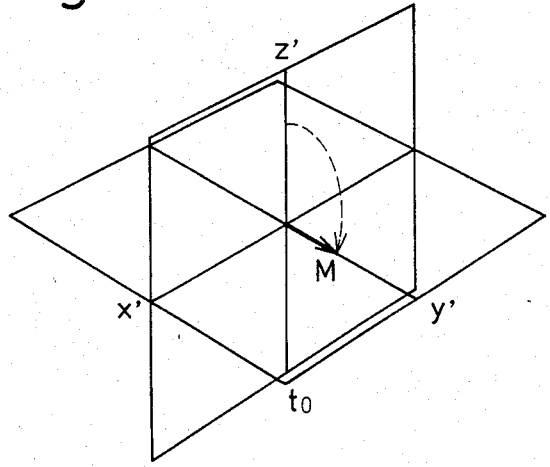
FIGS. 5A and 5B are diagram showing a magnetization M expressed in a revolving coordinate system.
Figure 5B:
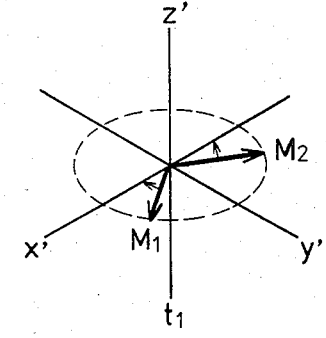
Figure 6:
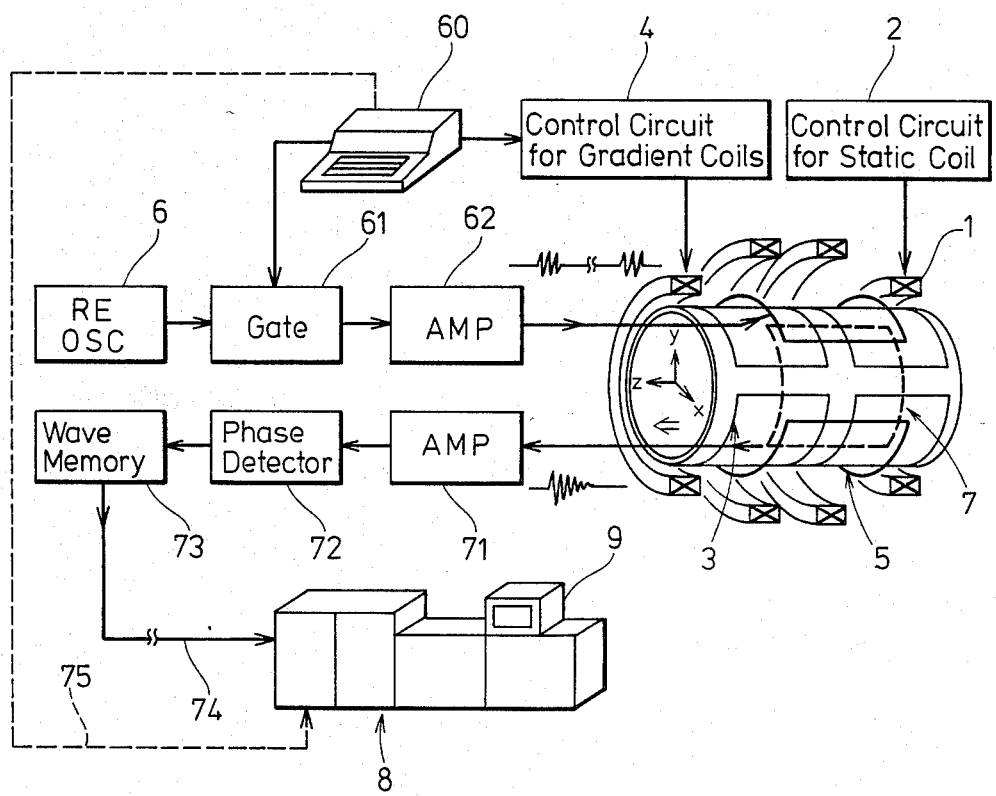
FIG. 6 is a block diagram of an apparatus according to the present invention.

FIG. 6 shows in block form an apparatus for carrying out methods according to the present invention. The apparatus includes a static coil 1 for producing a uniform static magnetic field $H_0$ in the direction of Z, and a control circuit 2 for controlling the static coil 1. The static coil 1 produces magnetic fluxes having a density $H_0$ of about 0.1 T. The uniformity of the produced magnetic fluxes should preferably be $10^{-4}$ or higher.

The apparatus also has a gradient coil assembly generally designated at 3, and a control circuit 4 for controlling the gradient coil assembly 3.

Figure 7A:
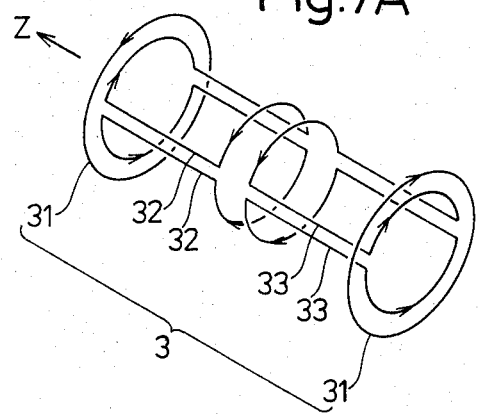
FIGS. 7A and 7B are schematic diagrams showing coils for producing magnetic fields.

FIG. 7A shows the gradient coil assembly 3 which is composed of a Z-gradient magnetic field coil 31, y-gradient magnetic field coils 32, 33, and x-gradient magnetic field coils (not shown) identical in shape to the y-gradient magnetic field coils and angularly displaced therefrom through 90°. The gradient coil assembly 3 serves to produce magnetic fields having straight gradients in the directions of x-, y- and z-axes in the same direction as that of the uniform magnetic field $H_0$. The control circuit 4 is controlled by a controller 60.

Figure 7B:
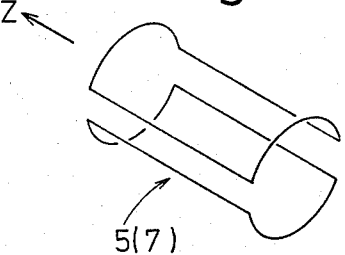

FIG. 7B illustrates an excitation coil 5 for applying as an electromagnetic wave RF pulses having a narrow frequency spectrum f to the body of a subject being examined.

The apparatus further includes an oscillator 6 for generating a signal having a frequency (42.6 MHz/T for protons, for example) corresponding to the NMR condition of atomic nuclei to be measured. The output from the oscillator 6 is applied to the excitation coil 5 through a gate circuit 61 which can be opened or closed by a signal from the controller 60 and an amplifier 62. A detection coil 7 serves to detect NMR signals emitted from the subject body and is of the same construction as that of the excitation coil 5 shown in FIG. 7B, the detection coil 7 being angularly spaced from the excitation coil 5 through 90°. It is preferable that the detection coil 7 be located as closely to the subject body as possible. The detection coil 7 may however be shared by the excitation coil 5.

The apparatus also comprises an amplifier 71 for amplifying the NMR signal (FID: free induction decay) produced by the detection coil 7, a phase detector 72, and a wave memory 73 for storing waveform signals as phase-detected from the amplifier 71, the wave memory 73 including an A/D converter. Signals from the wave memory 73 are fed through a transmission line 74 such as an optical fiber cable to a computer 8 which processes the supplied signals to obtain body-section images. The body-section images are then displayed on a display unit 9 such as a television monitor.

Operation of the apparatus thus constructed will be described with reference to FIGS. 8 and 9A through 9D.

The control circuit 2 passes an electric current through the static coil 1 to apply a static magnetic field $H_0$ to the body of a subject who is placed in the cylinder constituted by the coils. Under this condition, the controller 60 enables the control circuit 4 to pass an electric current through the Z-gradient magnetic field coil 31 to energize the latter to produce a Z-gradient magnetic field $Gz+$ as shown at (B) in FIG. 8. While the magnetic field $Gz+$ is being applied, the gate circuit 61 is opened to allow the signal from the oscillator 6 to be applied through the amplifier 62 to the excitation coil 5, thereby exciting a plane in the subject body with a 90° pulse having a narrow frequency spectrum as shown at (A) in FIG. 8. A waveform signal $Gz-$ is applied following the signal $Gz+$ as illustrated at (B) in FIG. 8 for bringing NMR signals from different parts of the subject body into phase with each other, a process which is known in the art.

Figure 8:
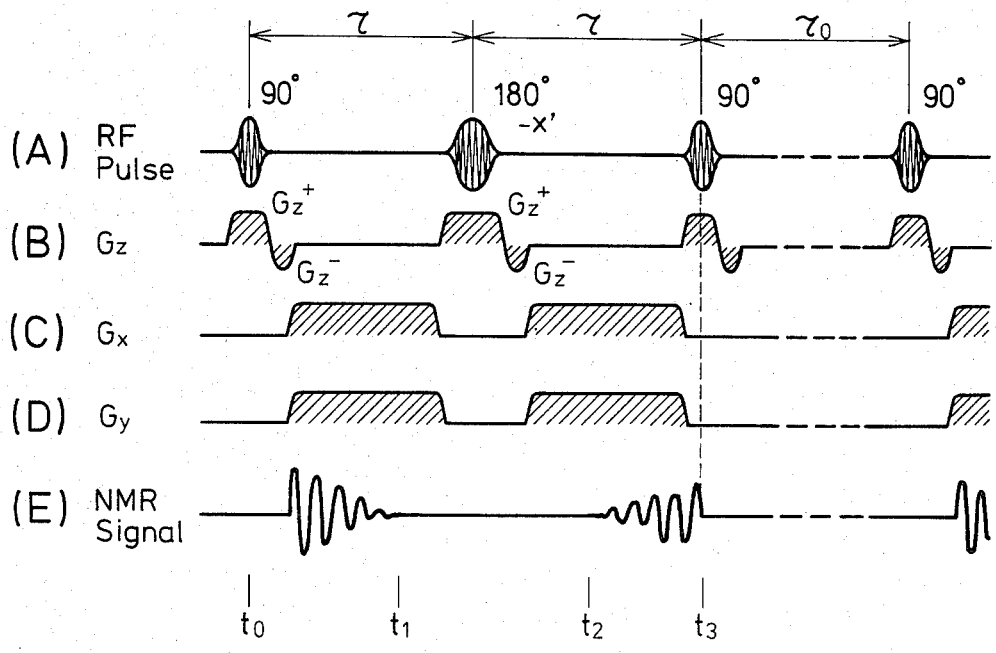
FIG. 8 is a diagram showing the waveforms of pulse trains generated in the apparatus of the invention.
Figures 9A, 9B, 9C, 9D:
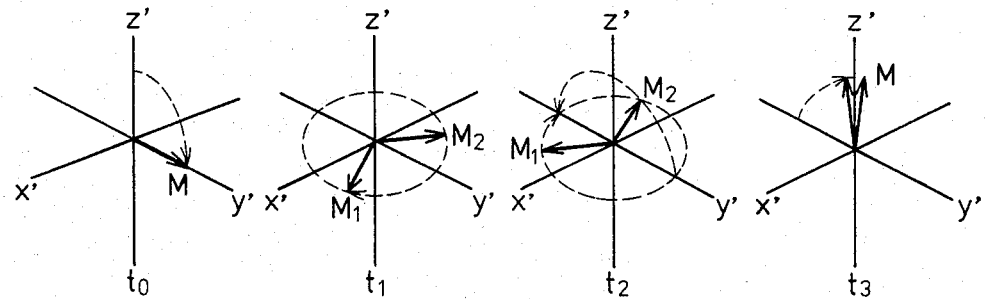
FIGS. 9A through 9D are diagrams showing a magnetization M expressed in a revolving coordinate system.

At the time $t_0$, a magnetization M changes its direction into conformity with the direction of the y'-axis through 90° as shown by the revolving coordinate system in FIG. 9A. Then, currents are passed through the x-gradient and y-gradient magnetic field coils 32, 33 to apply magnetic fields Gx, Gy of prescribed magnitudes to the subject body as shown at (C), (D) in FIG. 8, and an NMR signal from the detection coil 7 as shown at (E) in FIG. 8 is detected. When the NMR signal is detected at a time $t_1$, for example, the magnetization M is in the process of being gradually dispersed in the directions of the arrows shown in the dotted lines in the plane x', y' as illustrated in FIG. 9(B). Since the NMR signal as detected by the detection coil 7 is gradually decayed with time, it is amplified by the amplifier 71, phase-detected by the phase detector 72, and then applied through the wave memory 73 to the computer 8. The NMR signal fed to the computer 8 is then subjected to a Fourier transform to provide a signal for one projection. The operation up to this point is the same as that of the conventional apparatus.

Upon elapse of a time $\tau$ after which the NMR signal has been eliminated, the controller 60 passes again a current through the Z-gradient magnetic field coil 31 to produce the Z-gradient magnetic field $Gz+$ as shown at (B) in FIG. 8, and opens the gate circuit 61 to allow a current to be fed to the excitation coil 5 for thereby applying a 180°−x pulse (180°−x means inversion of the phase of the signal from the oscillator 6) to the same plane in the subject body as illustrated at (A) in FIG. 8. Thereafter, currents are passed through the x-gradient and y-gradient magnetic field ciols as shown at (C), (D) in FIG. 8 to apply the magnetic fields Gx, Gy simultaneously to the subject body.

When the 180°−x pulse is applied, the dispersed magnetization M starts to gather again as shown at (C) in FIG. 9, and an increasing NMR signal (called an echo signal) is detected by the detection coil 7 as shown at (E) in FIG. 8. This echo signal is at maximum the period of time $\tau$ after the 180°−x pulse has been imposed. Provided the subject body remains unchanged in condition for the interval of time $\tau$, the echo signal and the first NMR signal are symmetrical in waveform with respect to a time axis. At a time $t_3$, the gate circuit 61 is opened, and the excitation coil 5 is supplied with a current under the magnetic field $Gz+$ to apply a 90° pulse to the body as shown at (A) in FIG. 8, for thereby forcibly directing the magnetization M in the direction of a Z'-axis. At the time $t_3$, the magnetization M does not conform with the Z'-axis due to a relaxation time $T_2$ and is slightly dispersed as shown at (D) in FIG. 9.

Upon elapse of a short period of time $\tau_0$ thereafter, the magnetization M is in conformity with the Z'-axis through relaxation. The time interval $\tau_0$ after the time $t_3$ until the magnetization M is in conformity with the Z'-axis may be sufficiently shorter than the relaxation time $T_1$ since the magnetization M is only slightly deviated from the Z'-axis at the time $t_3$. The time interval $\tau_0$ may be about $4\tau$, for example.

Upon elapse of the time period $\tau_0$, the first sequence of operation is completed, and the same sequence will be repeated thereafter. In succeeding sequences, the magnetic fields Gx, Gy imposed on the subject body are slightly varied to enable the detection coil 7 to produce the NMR signal and echo signal in each sequence, that is, in each projection.

In each sequence, the computer 8 converts the NMR signal produced at first, for example, according to a Fourier transform, and effects reconstructive arithmetic operations to produce a body-section image according to the same known process (filtered-back projection) as that used in X-ray CT. The produced body-section image is then displayed on the display unit 9.

In the foregoing arrangement, it is assumed that the computer 8 utilizes no echo signal. However, the computer 8 may utilize both the NMR signal produced at first and the echo signal following the NMR signal. These signals may be utilized in the following ways:

(i) The NMR signal and a signal obtained by inverting the time axis of the echo signal are averaged, and the average is employed as data on one projection for reconstructive arithmetic operations, thereby generating a single body-section image;

(ii) The NMR signal is used to provide a proton-density image, and the difference between the NMR signal and a signal obtained by inserting the time axis of the echo signal is computed and employed as data on one projection for reconstructive arithmetic operations. A T$_2$ image is also produced based on a transverse relaxation time T$_2$ (caused by interaction of spins of adjacent electrons;

(iii) The proton-density image and the T$_2$ image obtained in the method (ii) are combined into another image; and (iv) NMR signals and echo signals in a plurality of sequences are averaged and the average is used as data on one projection.

By relying on the foregoing methods, the S/N ratio can be improved to generate images of good quality. These methods can be selected according to the object of a diagnosis for producing a body-section image that is best suited to the object.

While in the foregoing embodiment the electromagnetic pulses are applied to the subject body in the order of (90°+x) to (180°−x) to (90°+x), electromagnetic pulses may be used in the sequence of (90°+x) to (180°y′) to (90°−x).

Figures 10A, 10B, 10C, 10D:
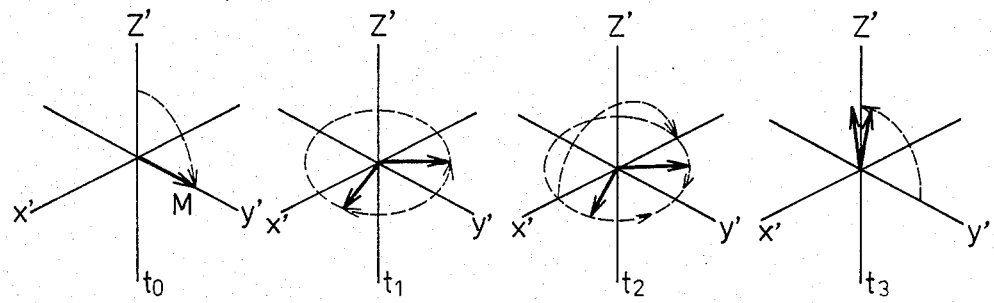
FIGS. 10A through 10D are diagrams illustrative of the directions of a magnetization M at different times when other pulse trains are employed according to a method of the present invention.

FIGS. 10A through 10D show orientations of the magnetization M at the times t$_0$, t$_1$, t$_2$, t$_3$ (FIG. 8) at the time the electromagnetic pulses are used in the sequence of (90°+x) to (180°y′) to (90°−x). When the 90° pulse is applied at the time t$_3$ when the echo signal is maximum, the magnetization M is forcibly directed from the y′-axis to the Z′-axis as shown in FIG. 10D. The 180° y′ pulse is obtained by delaying the signal from the oscillator 6 by the phase of 90°, and the 90°−x pulse is obtained by delaying the signal from the oscillator 6 by the phase of 180°.

Figure 11:
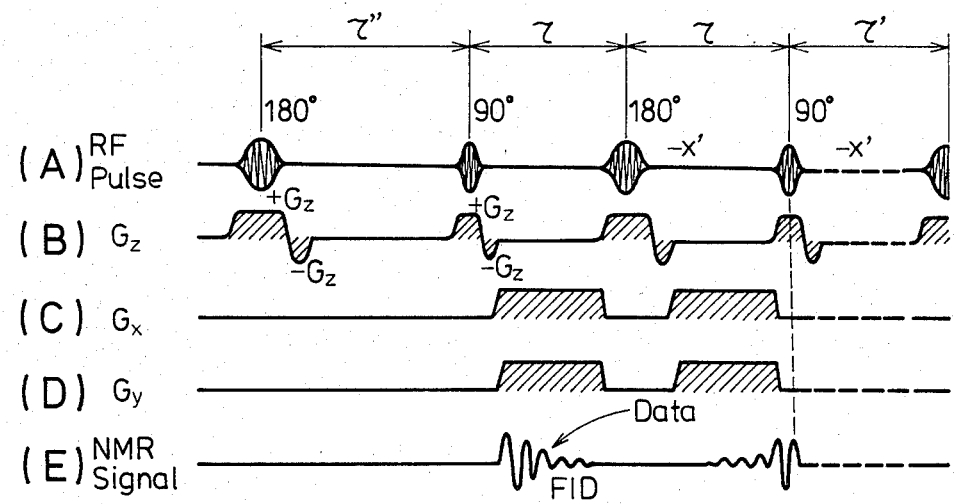
FIG. 11 is a diagram of the waveforms of pulse trains showing another method according to the present invention.

FIG. 11 shows the waveforms of signals applied and produced according to another method of the present invention. According to this method, a 180° pulse as shown at (A) in FIG. 11 is applied prior to application of the 90° pulse to the subject body (before a time interval τ″) in the method of FIG. 8. Simultaneously with this 180° pulse, the magnetic field Gz+ is applied to the subject body as shown at (B) in FIG. 11. The time interval τ″ required after the 180° pulse has been imposed and before the 90° pulse is applied should be long enough for the magnetization M to return to the original orientation after it has been inverted through 180° by the first 180°. With this method, the intensity of the NMR signal is varied due to relaxation of T$_1$ during the interval τ″, thereby allowing a T$_1$ image to be generated.

In the above description, an imaginary section of the subject body is specified by first applying the magnetic field Gz and then simultaneously applying the magnetic fields Gx, Gy. However, such an imaginary body section can be specified by other methods.

Other methods of the present invention will be described with reference to FIGS. 12 through 15, 17 and 18.

Figure 12:
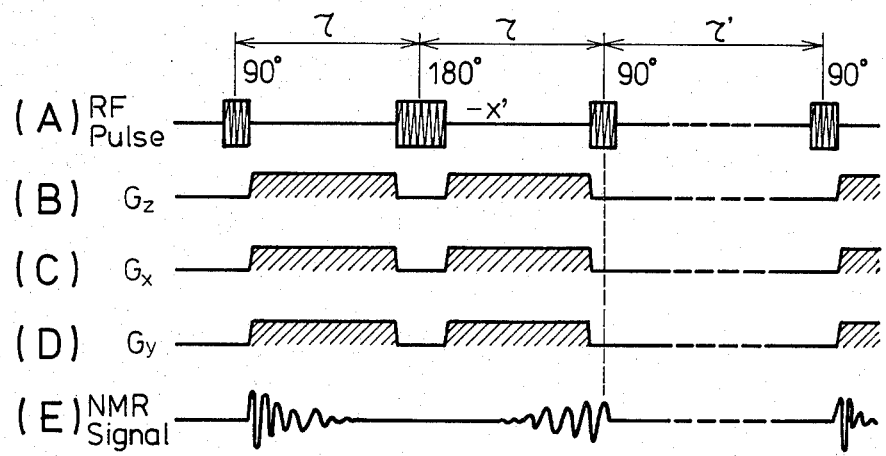
FIGS. 12 through 15, 17 and 18 are diagrams of the waveforms of pulse trains showing other methods according to the present invention.

FIG. 12 illustrates a method known as a three-dimensional PR process. According to this method, rectangular electromagnetic pulse signals are applied to the subject body as shown at (A) in FIG. 12, and at the same time, the magnetic fields Gz, Gx, Gy are applied to the subject body as shown at (B), (C), (D) in FIG. 12 for specifying the direction of projection in the subject body.

Figure 13:
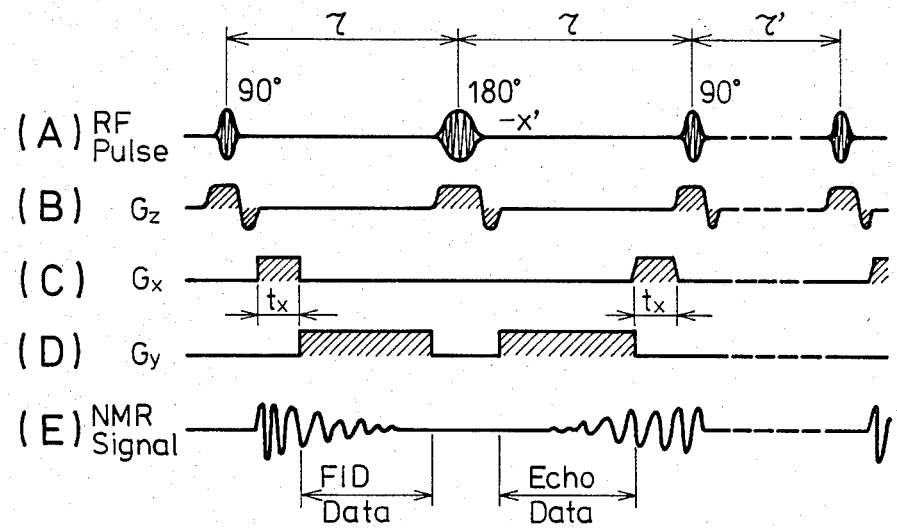

FIG. 13 shows a Fourier transform process in which a 90° electromagnetic pulse is first applied to excite a plane in the subject body as shown at (A) in FIG. 13 while the magnetic field Gz+ as shown at (B) in FIG. 13 is being imposed. Then, the magnetic field Gx is applied to the subject body for an interval of time tx as shown at (C) in FIG. 13 to calibrate the phase of the magnetization M in the direction of x according to the equation (3):

$$\gamma Lx \int_{tx} dt \cdot Gx = 2\pi n \quad (3)$$

where
Lx: the length of the subject body in x direction,
n: an integer (n=−N′/2, −N/2+1, ..., −1, 0, +1, N/2−1),
N: the number of divisions in x direction.

Then, an NMR signal is detected under the magnetic field Gy as shown at (D), (E) in FIG. 13 (the phase of the magnetization M is calibrated with Larmor angular velocities). Thereafter, as shown at (A) in FIG. 13, a 90° pulse is applied, and upon elapse of the time period τ, a 180°−x pulse is applied. The magnetic fields Gy, Gx, Gz are then successively impressed as shown at (D), (C), (B) in FIG. 13, and an echo signal is generated under these magnetic fields as shown at (E) in FIG. 13. When the echo signal is maximized (the period of time τ after the 180°−x pulse has been applied), a 90° pulse is applied under the magnetic field Gz+ as shown at (A) in FIG. 13, thereby orienting the magnetization M in the direction of the Z′-axis. Then, upon elapse of a period of time τ′, the foregoing sequence is repeated. In respective sequences, a pulse duration tx of the magnetic field Gx is successively varied to provide N NMR siganls. The N NMR signals are then sujected to a Fourier transform to generate body-section images.

In the above process, instead of successively varying the pulse duration tx of the magnetic field Gx, the pulse duration tx may be kept constant, and the magnitude of the magnetic field Gx may be varied successively.

Figure 14:
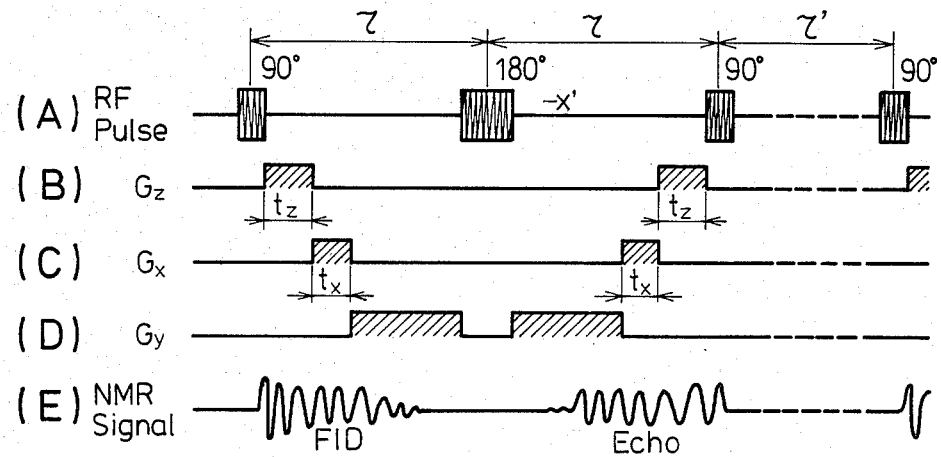

FIG. 14 shows a three-dimensional Fourier transform method. According to this method, a rectangular electromagnetic pulse as shown at (A) in FIG. 14 is first applied to the subject body, and the magnetic fields Gz, Gx, Gy applied for calibrating the subject body three-dimensionally in the x-, y- and z-axes are controlled in time so as to be applied successively to the subject body.

In the methods shown in FIGS. 13 and 14, a 180° pulse may be applied prior to a 90° pulse in each sequence in the manner similar to that shown at (A) in FIG. 11, thereby producing a T$_1$ image. With such a modification, the following pulse combinations are available:

(180°) to (90°) to (180°−x′) to (90°−x),
(180°) to (90°−x′) to (180°−x) to (90°), and
(180°) to (90°−x′) to (180°−y′) to (90°−x′).

Figure 15:
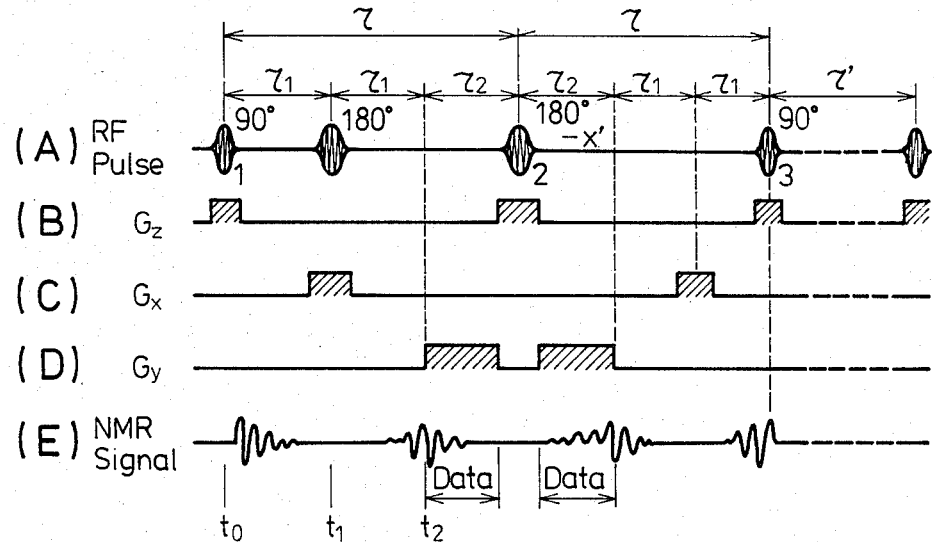

FIG. 15 is a waveform diagram illustrative of a selective excitation line process.

Figure 16A:
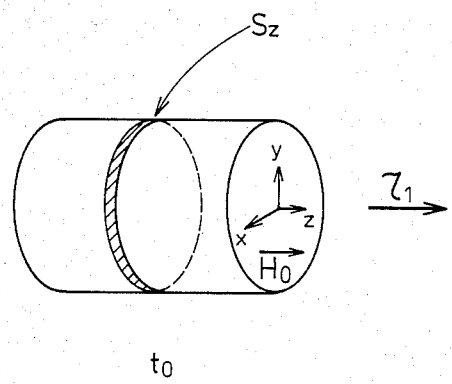
FIGS. 16A and 16B are diagrams showing planes of a subject body which are excited in the method shown in FIG. 15.
Figure 16B:
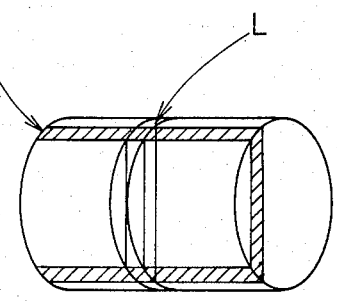

With this process, a 90° pulse is applied to the subject body under the magnetic field Gz as shown at (A), (B) in FIG. 15 to excite a plane Sz in the subject body as illustrated at FIG. 16A. Then, a 180° pulse is applied under the magnetic field Gx as shown at (A), (C) in FIG. 15 to excite a plane Sx in the subject body as in FIG. 16B. This induces an echo signal with protons on a line L where the planes Sz, Sz intersect as shown in FIG. 16B. At a time t$_2$ when this echo signal is maximum as shown at (E) in FIG. 15, the magnetic field Gy is imposed as shown at (D) in FIG. 15 to pick up the echo signal as data. The data is then subjected to a Fourier transform to thereby provide a proton density distribution on the line L.

Thereafter, a 180° −x pulse is applied under the magnetic field Gz, and then the magnetic fields Gy, Gx are applied to invert hysteresis in the plane Sz except the line L. When the magnetic field Gy is applied, the echo signal from the line L is picked up as data. At the time the successive echo signal in the plane Sz is at maximum, a 90° pulse is applied as shown at (A) in FIG. 15 to force the magnetization M in the plane Sz into conformity with the Z'-axis.

Figure 17:
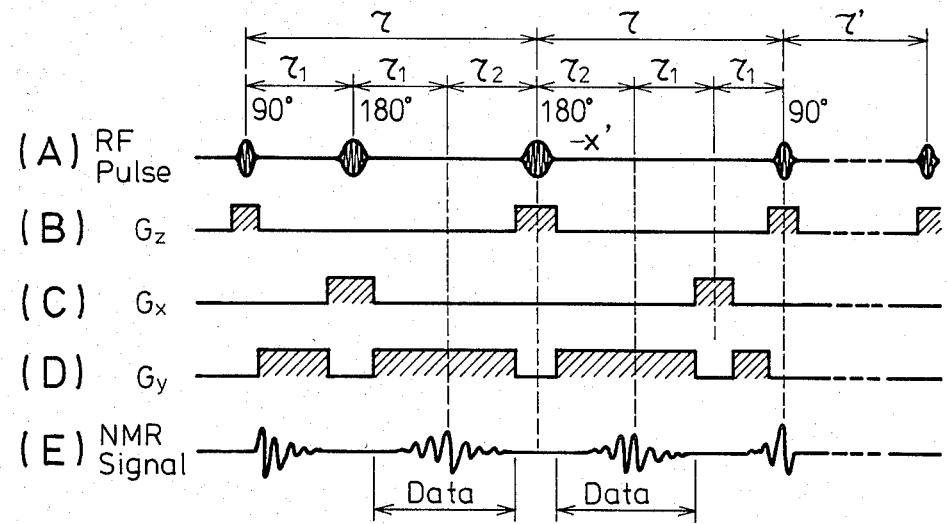

FIG. 17 is illustrative of a modification of the method shown in FIG. 15. The method of FIG. 17 is different from that of FIG. 15 in that the magnetic field Gy is applied at a different timing as shown at (D) in FIG. 17, and the overall echo signal is picked up as a data signal as shown at (E) in FIG. 17.

Figure 18:
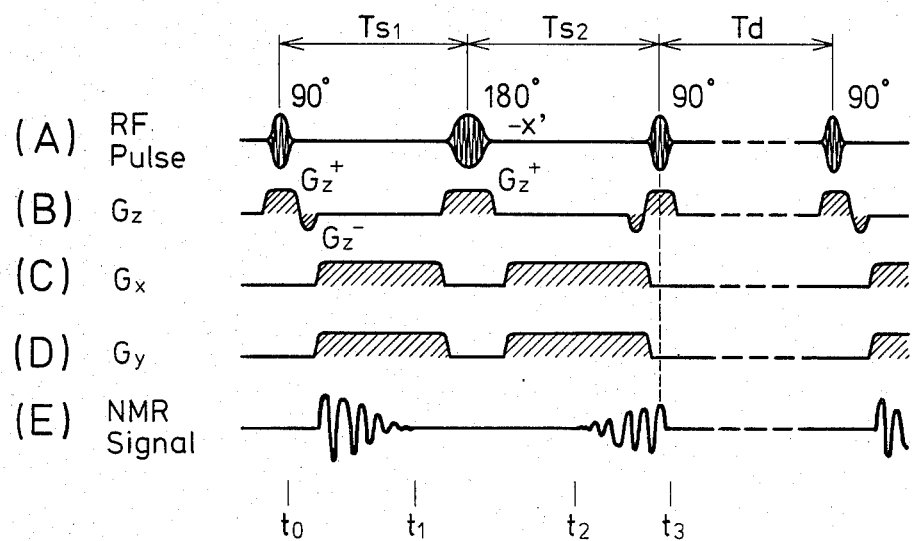

FIG. 18 shows a method in which at least one of a time interval $Ts_1$ required after a first 90° pulse has been applied and before a 180°−x' pulse is applied as shown at (A), a time interval $Ts_2$ required after the 180° pulse has been applied and before a 90° pulse is applied as shown at (A), and a time interval Td required after the 90° pulse has been applied and before the first 90° pulse in a next following sequence is applied, in the method shown in FIG. 8, is varied in each sequence in measuring the intensity V of an NMR signal, and a plurality of such intensities V are obtained from each part of the subject body. According to this method, the computer effects arithmetic operations between images based on a plurality of signal intensities V for determining a spin-lattice relaxation time $T_1$, a spin-spin relaxation time $T_2$, and a two- or three-dimensional image of atomic nucleus densities.

It is now assumed that the time intervals Td, $Ts_1$ and $Ts_2$ have the following relationship:

$$Ts_1 = Ts_2 = Ts$$

and the time durations of the 90° and 180° pulses are sufficiently short, the intensity V (proportional to a transverse magnetization $My^+$) of an NMR signal can be expressed by the equation (4):

$$V = \frac{1 - \exp\left(-\frac{Td}{T_1}\right)}{1 - \exp\left(-\frac{Td}{T_1} - 2\frac{Ts}{T_2}\right)} M \quad (4)$$

where M is the proton density proportional to a magnetization $M_0$ in a state of thermal equilibrium.

The intensity V' of an echo signal is related to the NMR signal intensity V by $$V' = V \exp(-2Ts/T_2)$$

This equation means that the same consitions as those of the NMR signal are applicable to the echo signal except that the intensity of the echo signal is slightly smaller than the intensity V of the NMR signal. The following description will be directed to the NMR signal.

Figure 19:
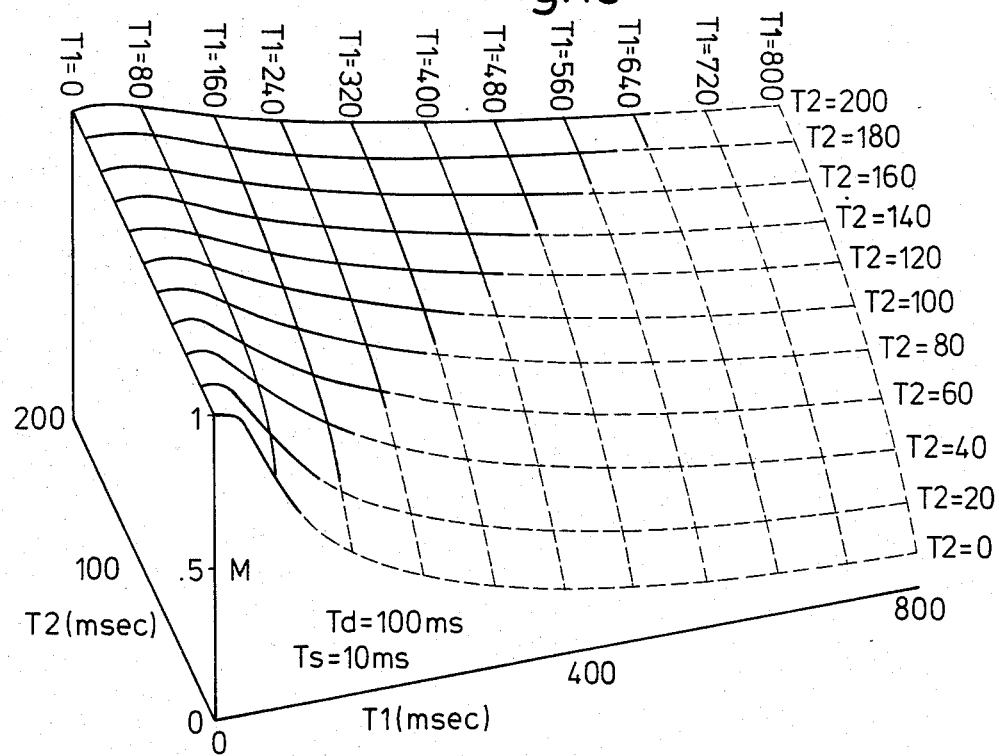
FIG. 19 is a diagram showing intensities V of NMR signals with respect to relaxation times $T_1$, $T_2$.

FIG. 19 shows how the intensity V of the NMR signal varies when the relaxation times $T_1$, $T_2$ are different with M=1. Study of FIG. 19 indicates that the intensity V varies with the relaxation times $T_1$, $T_2$ and any image data obtained can be varied according to the relaxation times $T_1$, $T_2$. The example shown in FIG. 19 is given when Td=100 mS and Tx=10 mS. The intensity V also varies with a time interval Td or Ts which defines sequences. This enables information related to $T_1$ or $T_2$ to be derived from several images having different times Td or Ts.

Figure 20:
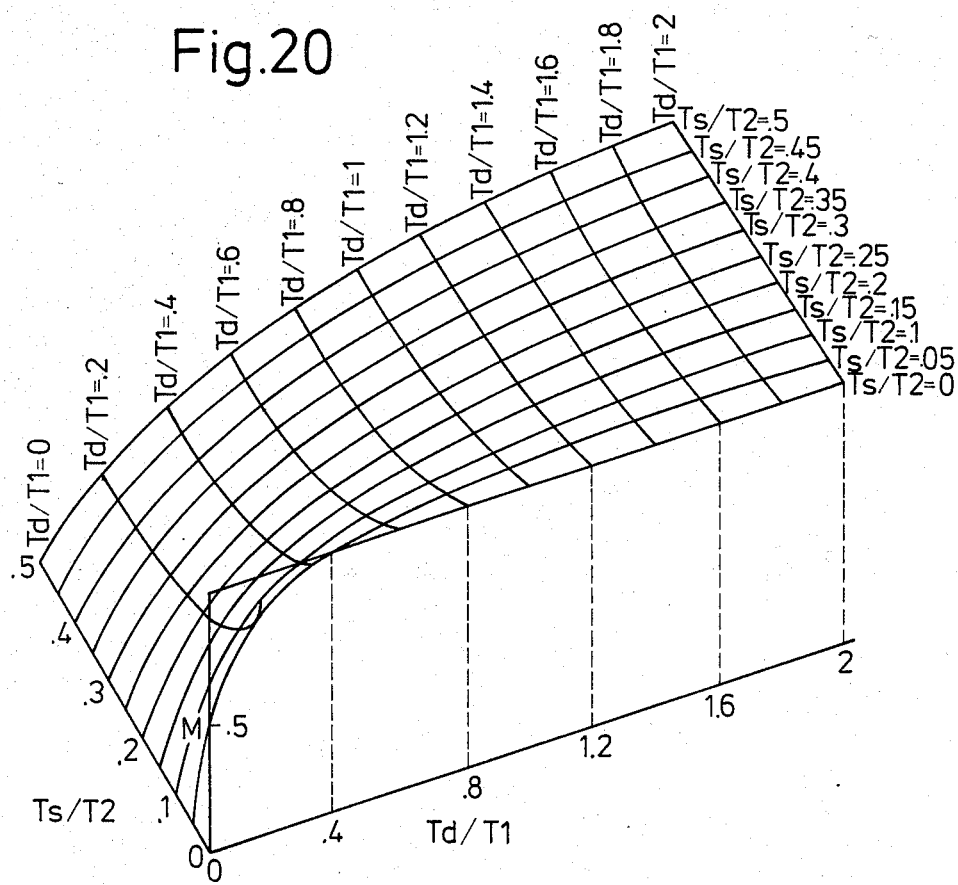
FIG. 20 is a diagram showing intensities V of NMR signals with ratios $Td/T_1$, $Ts/T_2$ used as parameters.

FIG. 20 shows signal intensities with ratios $Td/T_1$, $Ts/T_2$ used as parameters. When $Td/T_1 < 1$, $Ts/T_2 < 0.1$, the intensities can be rendered widely different according to the relaxation times $T_1$, $T_2$. It is preferable to make the times $Ts_1$, $Ts_2$ shorter than the relaxation time $T_2$, and the time Td shorter than the relaxation time $T_1$.

The foregoing nature, that is, the equation (4) is utilized such that the intensity V of the NMR signal is measured while varying the times Td, Ts as parameters to provide an equation having the relaxation times $T_1$, $T_2$ as unknowns. Since as many such equations can be established as there are variations in the times Td, Ts, the relaxation times $T_1$, $T_2$ can be determined by solving simultaneous equations.

More specifically, with the method shown in FIG. 18, information on the time Td, $Ts_1$ and $Ts_2$ is given from the controller 60 through a transmission line 75 (shown by the dotted line in FIG. 6) to the computer 8 to allow the latter to establish simultaneous equations. The relaxation times $T_1$, $T_2$ and the proton density M can be found by solving these simultaneous equations.

NMR signals observed actually include noise, and these intensities V may not necessarily be measured precisely. To cope with this, the unknowns $T_1$, $T_2$, M can be found through a least square estimation process based on more measured data than the unknowns $T_1$, $T_2$, M, so that any measurement errors due to noise can be minimized, and correct unknowns $T_1$, $T_2$, M can be determined. The relaxation time $T_1$ or $T_2$ or the proton density M thus computed is used as data for constructing an image of a distribution of relaxation times with respect to a sectional image of the subject body. The images of the relaxation times $T_1$, $T_2$ are especially important as standard NMR images.

An embodiment in which the relaxation times $T_1$, $T_2$ are computed by solving simultaneous equations according to the method illustrated in FIG. 18 will now be described.

On the assumption that V/M=V, that is, M=1, and $-Td/T_1 = \alpha$ and $-2Ts/T_2 = \beta$ in the equation (4), the equation (4) can be modified into:

$$V = \frac{1 - \exp(\alpha)}{1 - \exp(\alpha + \beta)} \quad (5)$$

From the equation (5), there can be obtained:

$$\exp(\alpha) = \frac{V - 1}{V \exp(\beta) - 1} \quad (6)$$

or $$\exp(\beta) = \frac{V - 1 + \exp(\alpha)}{V \exp(\alpha)} \quad (7)$$

From the equation, the following equation can be derived:

$$\exp\left(-\frac{Td}{T_1}\right) = \frac{V - 1}{V \exp(\beta) - 1} \quad (8)$$

The equation (8) is solved for $T_1$ by:

$$T_1 = \frac{-Td}{\log_e[(V-1)/\{V\exp(-2Ts/T_2) - 1\}]} \quad (9)$$

By changing the time Ts into a new time:

$$Ts' = 2Ts$$

the NMR intensity V is changed into an intensity V', and the following equation is also established like the above equation (9):

$$T_1 = \frac{-Td}{\log_e[(V'-1)/\{V'\exp(-2Ts'/T_2) - 1\}]} \quad (10)$$

Since the relaxation time $T_1$ remains the same, the right-hand sides of the equations (9) and (10) are equal to each other as follows:

$$\frac{V-1}{V\exp(-2Ts/T_2) - 1} \quad (11)$$

$$\frac{V'-1}{V'\exp(-2Ts'/T_2) - 1}$$

With $\exp(\beta) = B$, since $\exp(2\beta) = B$, the equation (11) becomes the following quadratic equation:

$$V'(V-1)B^2 - V(V'-1)B + (V'-V) = 0 \quad (12)$$

and the root of $B^2$ can then be solved by:

$$B = \frac{1}{2V'(V-1)}[V(V'-1) - \sqrt{V^2(V'-1)^2 - 4V'(V-1)(V'-V)}\,]$$

By equalizing the righthand side to F (V, V'), the equation (13) can become:

$$\exp(-2Ts/T_2) = F(V, V')$$

that is, $$T_2 = \frac{-2Ts}{\log_e[F(V, V')]} \quad (14)$$

By placing this in the equation (8), $$\exp\left(-\frac{Td}{T_1}\right) = \frac{V-1}{V \cdot F(V,V') - 1} \quad (15)$$

This equation is solved for $T_1$ as follows:

$$T_1 = \frac{-Td}{\log_e\left[\frac{V-1}{V \cdot F(V,V') - 1}\right]} \quad (16)$$

As described above, the relaxation times $T_1$, $T_2$ can be determined from the NMR signals (Td, Ts, V) and (Td, 2Ts, V') generated by the two pulse trains.

Although in the above embodiment the time Ts has been changed into a doubled value, the principles are equally applicable in general if the time Ts is increased n times or reduced to 1/n (n may not be an integer).

The manner in which the time Td is changed will be described.

The equation (7) is solved for $T_2$ as follows:

$$T_2 = \frac{-2Ts}{\log_e\left[\frac{V-1+\exp(-Td/T_1)}{V\exp(-Td/T_1)}\right]} \quad (17)$$

Assuming that $2Td = Td'$, and if the intensity V' of the NMR signal is measured with respect to the time Td', then the following equation results:

$$\frac{V-1+\exp(-Td/T_1)}{V\exp(-Td/T_1)} = \frac{V'-1+\exp(-Td'/T_1)}{V'\exp(-Td'/T_1)} \quad (18)$$

If $\exp(-Td/T_1) = A$, then, $\exp(-Td'/T_1)$, and the equation (18) can be rewritten as the following quadratic equation:

$$(V'-V)A^2 + V'(V-1)A - V(V'-1) = 0 \quad (19)$$

This quadratic equation is solved for A as follows:

$$A = \frac{1}{2V'(V'-V)}[V(V'-1) - \sqrt{V'^2(V-1)^2 - 4V'(V-1)(V'-V)}\,] \quad (20)$$

By equalizing the righthand side to G (V, V'), the equation (20) can become:

$$\exp(-Td/T_1) = G(V, V') \quad (21)$$

This equation is solved for $T_1$ by:

$$T_1 = \frac{-Td}{\log_e[G(V, V')]} \quad (22)$$

By placing this in the equation (7), $$\exp\left(-2\frac{Td}{T_1}\right) = \frac{V-1+G(V,V')}{V \cdot G(V,V')} \quad (23)$$

From this, the following equation is derived:

$$T_2 = \frac{-2Ts}{\log_e\left[\frac{V-1+G(V,V')}{V \cdot G(V,V')}\right]} \quad (24)$$

Accordingly, the relaxation times $T_1$, $T_2$ can be determined by fixing the time T2 and changing the time Td. In the above embodiment the time Td has been changed into a doubled value. However, the relaxation times can be found if the time Ts is increased n times or reduced to 1/n.

It has been assumed in the above embodiments that the proton density is 1. If the proton density is not 1, and V is expressed as V/M, then F (V, V') can be rewritten as F (V/M, V'/M), and G (V, V') as G (V/M, V'/M). Therefore, the relaxation times $T_1$, $T_2$ can similarly be determined from the above equations when the proton density is not 1.

The relaxation times $T_1$, $T_2$ can be computed on a real-time basis by a programmed information processing apparatus.

The method shown in FIG. 18 is applicable to the methods shown in FIGS. 12 through 15 for determining the relaxation times $T_1$, $T_2$ and the proton density M in the similar manner.

Figure 21:
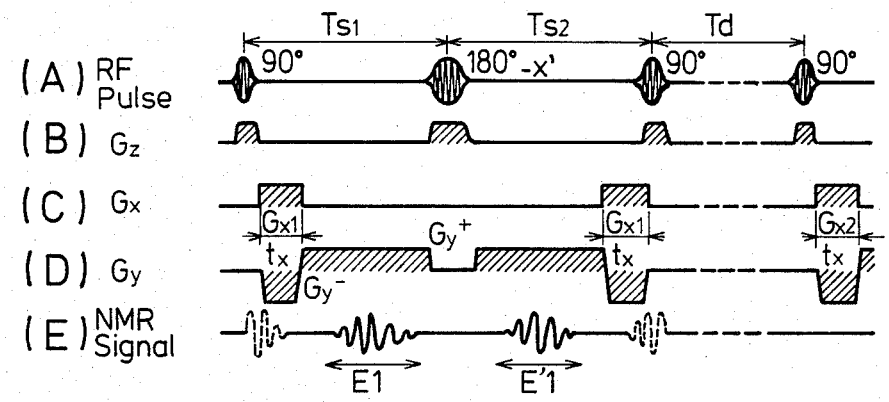
FIG. 21 is a diagram showing the waveforms of pulse trains employed when the method of FIG. 18 is applied to a spin-warp process.

FIG. 21 is a waveform diagram showing pulse waveforms applied and produced when the method of FIG. 18 is incorporated in a spin-warp process. As shown at (C) in FIG. 21, an x-axis gradient magnetic field Gx is applied for a fixed period of time tx, and magnetic fields $Gx_1$, $Gx_2$, ... having different magnitudes are applied in respective sequences. As shown at (D) in FIG. 21, a y-axis gradient magnetic field Gy− is applied while the magnetic field Gx is being applied. When a magnetic field Gy+ is imposed while the magnetic field Gx is being applied, the magnetization is dispersed and the NMR signal is reduced and rapidly eliminated as shown by the dotted lines at (E) in FIG. 21. When the y-axis gradient magnetic field Gy+ is then applied as shown at (D) in FIG. 21, the magnetization is gathered again, and an echo signal appears which varies as shown at (E) in FIG. 21. This echo signal is detected as data $E_1$, $E_1'$ while the magnetic field Gy+ is being imposed. The signal intensity V' at this time can be expressed on the basis of the equation (3) as follows:

$$V' = V \times exp(-2Tx/T_2),$$

and relaxation times $T_1$, $T_2$ and an image of M can similarly be obtained.

With the arrangement of the present invention, the orientation of a magnetization M is forcibly changed by a train of at least three pulses (90° pulse, 180° pulse and 90° pulse), and the magnetization M is brought back into a state of thermal equilibrium within a short period of time. Therefore, a body-section image related to a particular atomic nucleus distribution in the body of a subject being examined can be rendered available in a reduced period of time.

Since an NMR signal and an echo signal can be produced from the subject body, these signals can be utilized to provide a body-section image of a good S/N ratio and an improved resolving power.

By changing time intervals at which RF pulses are applied in respective sequences and observing NMR signal intensities at the same time, relaxation times $T_1$, $T_2$ and a proton density M can be determined through simple arithmetic operations.

Although certain preferred embodiments have been shown and described, it should be understood that many changes and modifications may be made therein without departing from the scope of the appended claims.

What is claimed is:

1. An examination method utilizing a nuclear magnetic resonance technique in which the body of a subject to be examined is placed in an uniform static magnetic field and subjected to an electromagnetic wave having a frequency which induces nuclear magnetic resonance, a magnetic field is also applied to the subject body to specify an area of the body from which nuclear magnetic resonance (NMR) signals are radiated, and such nuclear magnetic resonance signals from the specified body area are received, the method comprising the steps of:

applying a first 90° pulse as the electromagnetic wave to the body to excite the same;
then applying a 180° pulse to the body to produce an echo signal;
applying a second 90° pulse to the body when said echo signal is maximum to thereby allow a magnetization to return to a state of thermal equilibrium; and
thereafter repeating the foregoing sequence of the steps at prescribed intervals.

2. An examination method according to claim 1, wherein an NMR signal obtained in a single sequence and a signal obtained by inverting a time axis of the echo signal are averaged, and the average value is employed as data for one projection.

3. An examination method according to claim 1, wherein the difference between an NMR signal and a signal obtained by inverting a time axis of the echo signal is computed and employed as data for one projection, said data being computed according to prescribed arithmetic operations to provide a $T_2$ image.

4. An examination method according to claim 1, wherein a plurality of NMR signals and/or a plurality of echo signals generated in a plurality of sequences are averaged, and the average value is employed as data for one projection.

5. An examination method according to claim 1, wherein at least one of a time interval $Ts_1$ required after a first 90° pulse has been applied and before a 180° pulse is applied, a time interval $Ts_2$ required after the 180° pulse has ben applied and before a second 90° pulse is applied, and a time interval Td required after the second 90° pulse has been applied and before the first 90° pulse is applied, is varied in each sequence in measuring the intensity V of an NMR signal, and a plurality of such intensities V are obtained from each part of the subject body, at least one of a $T_1$ image, a $T_2$ image, and a proton-density image is obtained through arithmetic operations between images based on the plurality of intensities V.

6. An examination method utilizing a nuclear magnetic resonance technique in which the body of a subject to be examined is placed in an uniform static magnetic field and subjected to an electromagnetic wave having a frequency which induces nuclear magnetic resonance, a magnetic field is also applied to the subject body to specify an area of the body from which nuclear magnetic resonance (NMR) signals are radiated, and such nuclear magnetic resonance signals from the specified body area are received, the method comprising the steps of:

applying a 180° pulse as the electromagnetic wave to the body;
applying a 90° pulse to the body to excite the same a predetermined time interval after the 180° pulse has been applied;
then applying a 180° pulse to the body to produce an echo signal;
applying a 90° signal again to the body when said echo signal is maximum to thereby allow a magnetization to return to a state of thermal equilibrium;
thereafter repeating the foregoing sequence of the steps at prescribed intervals; and
effecting prescribed arithmetic operations on NMR signals obtained in the respective sequences for thereby producing a $T_1$ image.

7. An examination apparatus utilizing a nuclear magnetic resonance technique, comprising:
means for applying a uniform static magnetic field to the body of a subject;
means for producing magnetic fields to specify an area of the body from which a nuclear magnetic resonance (NMR) signal is to be radiated;

excitation means for applying electromagnetic pulses to the body;

control means for controlling signals to be fed to said excitation means;

means for detecting the NMR signal from the body;

arithmetic means for processing signals from said detecting means and effecting arithmetic operations on the signals to obtain a body-section image; and said control means being operable by applying a first 90° pulse as the electromagnetic wave to the body to excite the same, then applying a 180° pulse to the body to produce an echo signal, applying a second 90° pulse to the body when said echo signal is maximum to thereby allow a magnetization to return to a state of thermal equilibrium, and thereafter repeating the foregoing sequence of the steps at prescribed intervals.

* * * * *